(12) United States Patent
Obszarny

(10) Patent No.: US 6,176,967 B1
(45) Date of Patent: Jan. 23, 2001

(54) REACTIVE ION ETCH CHAMBER WAFER MASKING SYSTEM

(75) Inventor: Christopher E. Obszarny, Poughkeepsie, NY (US)

(73) Assignee: International Business Machines Corporation, Armonk, NY (US)

(*) Notice: Under 35 U.S.C. 154(b), the term of this patent shall be extended for 0 days.

(21) Appl. No.: 09/154,271

(22) Filed: Sep. 16, 1998

(51) Int. Cl.[7] .................................................. C23F 1/02
(52) U.S. Cl. ................................................... 156/345
(58) Field of Search ........................ 156/345; 216/45; 204/298.11

(56) References Cited

U.S. PATENT DOCUMENTS

| | | |
|---|---|---|
| 2,639,392 | 5/1953 | Warner, Jr. . |
| 3,271,286 | 9/1966 | Lepselter . |
| 3,530,824 | 9/1970 | Illsley et al. . |
| 3,561,993 | 2/1971 | Geffcken . |
| 3,971,684 | 7/1976 | Muto . |
| 4,436,602 | 3/1984 | Harra et al. . |
| 4,599,970 | 7/1986 | Peterson . |
| 4,627,379 | 12/1986 | Roberts et al. . |
| 4,661,203 | * 4/1987 | Smith et al. ................ 156/345 X |
| 4,734,152 | * 3/1988 | Geis et al. ................... 156/345 X |
| 4,856,955 | * 8/1989 | Yaguchi et al. ................. 414/278 |
| 5,301,013 | 4/1994 | Meijer et al. . |
| 5,328,722 | 7/1994 | Ghanayem et al . . |
| 5,338,424 | 8/1994 | Drimer et al. . |
| 5,451,261 | 9/1995 | Fujii et al. . |

* cited by examiner

Primary Examiner—Thi Dang
(74) Attorney, Agent, or Firm—Scully, Scott, Murphy & Presser; Jay H. Anderson, Esq.

(57) ABSTRACT

Disclosed are shielding platters for semiconductor wafers, and more particularly a reactive ion etch (RIE) chamber wafer masking system, wherein a mechanical mask facilitates the implementation of multiple etches on a single semiconductor wafer.

7 Claims, 1 Drawing Sheet

REACTIVE ION ETCH CHAMBER WAFER MASKING SYSTEM

BACKGROUND OF THE INVENTION

The present invention relates to reactive ion etch (RIE) systems. More particularly, the invention relates to a RIE chamber wafer masking system, wherein a mechanical mask facilitates the implementation of multiple etches on a single semiconductor wafer.

Devices fabricated on semiconductor wafers are becoming increasingly complex, as are the tools and processing steps employed in building those devices. The cost of processing a single semiconductor wafer is likewise continually increasing. Accordingly, there is an ongoing need for innovative tooling solutions in order to control processing costs wherever possible.

In the development and control of RIE processes, it is common to etch patterns under several different conditions in order to define the limits of a specific process or process capability. Testing of a RIE process for production requires that a wafer be etched under conditions as close as possible to those in an actual production tool. This often requires that one entire wafer be etched at a particular set of conditions. Determining the optimum process with this approach may require a large number of wafers, which are not only expensive, but at times may be impractical or even impossible to procure. Consequently, any reduction in the quantity of wafers employed will result in considerable cost savings.

Workers in RIE process development have used a technique of mechanically masking a portion of a wafer during an etch process test, thereby preserving the masked area of the wafer for use in a subsequent test. This technique permits a single test wafer to be used in multiple etching conditions, so that fewer wafers need be used for process testing. However, the use of mechanical masks has not been extensive, inasmuch as the mask surface composition ordinarily does not match that of the semiconductor wafer surface; this causes the etching plasma to be unstable and not representative of the plasma during actual production. In addition, placing a mechanical mask directly on the wafer to be etched may damage the wafer surface.

Accordingly, it is desirable to provide a shielding or masking platter for a semiconductor wafer which permits localized etching of the wafer in order to provide for multiple etches at different locations (thereby resulting in the saving of wafers), while allowing a stable plasma which mimics the conditions in the production RIE process.

The shielding or masking of all or at least a portion of the surface of semiconductor wafers during processing or etching thereof has long been utilized in industry. In particular, lithographic processes related to RIE are well known, wherein a masking material deposited on a wafer has patterns formed therein to shield regions of the semiconductor wafer surface from the RIE plasma.

Reactive ion etching (RIE) of semiconductor wafers or chips has been employed for a considerable number of years. For example, Muto (U.S. Pat. No. 3,971,684) describes a RIE chamber utilized for etching thin film circuits on a substrate, wherein the substrates to be etched are covered by masks and positioned on a cathode electrode which is enclosed in the chamber. The chamber also contains a chemically reactive gas employed as an etchant; the cathode is negatively biased so as to ionize the reactive gas and attract the chemically reactive ions toward the cathode. However, the disclosure in Muto does not contemplate the use of a mechanical mask which will enable multiple etches to be performed on a single semiconductor wafer.

Peterson (U.S. Pat. No. 4,599,970) discloses an apparatus for coating a selected area of the surface of an object, wherein a mask is employed for covering portions of the body surface. The mask has openings to expose the exact areas of the object which are to be coated. There is no disclosure of a reactive ion etch chamber for carrying out etching of semiconductor wafers wherein a mechanical mask apparatus or shielding structure is capable of enabling multiple etches at different locations using different processes on a single semiconductor wafer. Moreover, as noted above, a simple mechanical wafer mask has limited use in RIE process development due to the mismatch of materials between the mask and the wafer surface.

Geffcken (U.S. Pat. No. 3,561,993) discloses a method of producing cyclically extending layers, in which similar layers are deposited in a cyclical form through the use of diaphragms forming radial slits therebetween; this arrangement essentially provides; a mask system. The particular mask system as described in this patent is used in material deposition rather than etching, and provides for two moving plates instead of a fixed plate making contact with the object being processed. Thus, although different parts of a wafer may be etched or have material deposited thereon, this disclosure does not utilize a masking or shielding apparatus for a reactive ion etching chamber as contemplated by the present invention.

SUMMARY OF THE INVENTION

The present invention provides a masking system for use in reactive ion etch chambers, which will facilitate etching of individual semiconductor wafers at different locations on the surface thereof. A shielding platter (in effect, a mechanical mask) is provided with a cut-out portion, exposing a portion of the wafer surface through a window which is formed by the cut-out. The mechanical mask is essentially a platter including a shield and a stand-off, so that a gap is present between the surface of the wafer and the surface of the shield facing thereto. Furthermore, the material of the shielding platter (or at least the surface thereof facing the interior of the etching chamber) is essentially compatible with the material of the wafer surface, thereby improving stability of the etching plasma.

The etching tool may include a specialized mechanical loading system, such as a vacuum handling arrangement. With such a system, shielding platters can be readily loaded onto the wafer surface while maintaining a stand-off therewith. The windows in the shielding platters permit the etching of the wafer portion therebelow, while the shield surface itself is etched.

The windows in the shield can have various sizes, shapes and distributions so as to fit specific user requirements. The stand-off may surround the entire outer edge of the shielding platter, as well as all openings about the areas which are to be etched. This stand-off serves to stabilize the platter above the wafer surface while minimizing contact with the wafer and possible mechanical damage thereto.

The shielding platter and the masking system may be designed so that, subsequent to reactive ion etching, the platter may be lifted away from the semiconductor wafer, rotated and again placed on the wafer. Another etch or series of etches may then be performed at different locations on the wafer surface. In this manner, a single semiconductor wafer may be processed under many different conditions and readily evaluated at the completion of the etching sequences.

According to an additional aspect of the invention, specially constructed shielding platters can be loaded onto the wafer surface. These shielding platters are designed to possess special surface properties in order to match the composition of the surfaces of the wafers; for example, 40% polymer and 60% silicon; or 30% polymer, 40% silicon, 30% nitride; and so forth, as may be required by particular circumstances or applications.

According to still another aspect of the invention, there may be provided a library of shielding platters which are stored in a suitable container, with each shielding platter designed for use with a specific wafer size and containing different sizes, types and numbers of windows to permit different patterns or areas to be etched on the wafer surfaces, as may be required by a user.

Accordingly, it is an object of the present invention to provide a novel masking system for the reactive ion etching of semiconductor wafers.

A more specific object of the present invention is to provide a shielding platter structure having a window structure for enabling the etching of a semiconductor wafer on multiple locations thereof, in accordance with rotation or displacement of the shielding platter on the wafer.

It is a further object of the present invention to provide a shielding platter utilized in the reactive ion etching of various surface areas of a semiconductor wafer surface through at least one window or cutout in the shielding platter, wherein the masking platter is arranged at a stand-off from the surface of the semiconductor wafer. The purpose of this arrangement is to minimize possible mechanical damage to wafer during relative movement or shifting between the platter and the wafer.

A still further object of the present invention is to provide a shielding platter utilized in the reactive ion etching of semiconductor wafers, wherein the composition of at least the surface of the shielding platter is compatible with the composition of the semiconductor wafer.

It is yet another object of the present invention to provide a library of shielding platters, each having suitable cutouts or windows of varying designs and numbers, for enabling the etching of different patterns on areas of semiconductor wafer surfaces as may be required by particular user demands, and which are adapted to be manipulated by simple mechanical handling tools.

BRIEF DESCRIPTION OF THE DRAWINGS

Reference may now be had to the following detailed description of a preferred embodiment of the invention, taken in conjunction with the accompanying drawings, in which.

DETAILED DESCRIPTION OF A PREFERRED EMBODIMENT

Figure 1:
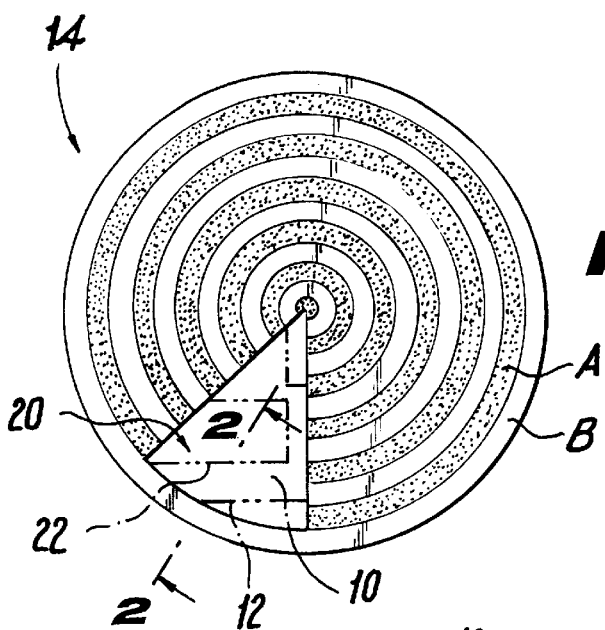
FIG. 1 is a top plan view of a shielding platter structure in accordance with the invention.
Figure 2:
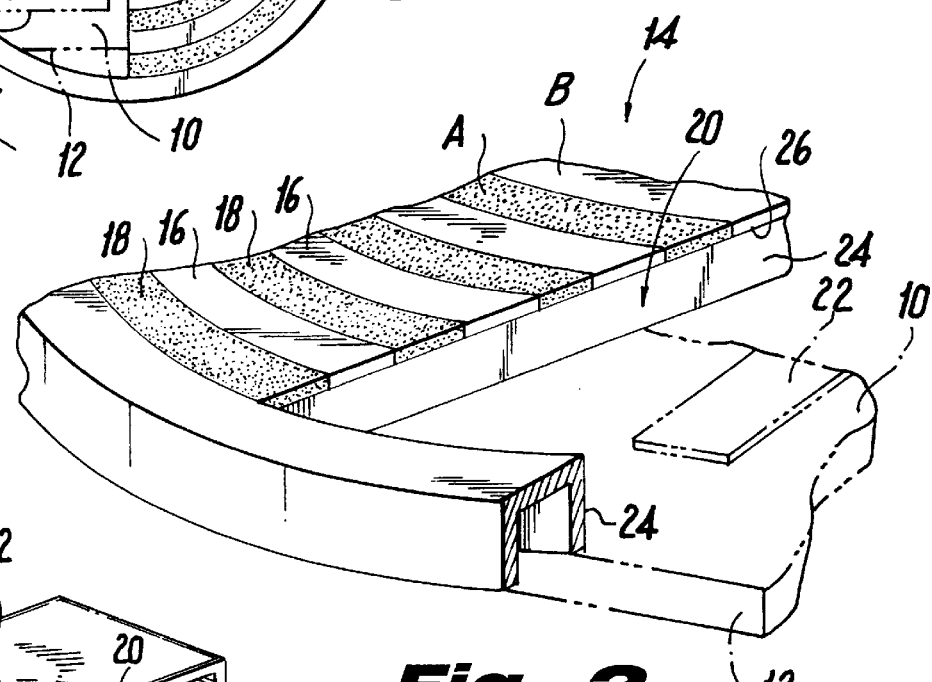
FIG. 2 illustrates, on an enlarged scale, a sectional view of a detail portion through the window region of the shielding platter taken along line 2—2 in FIG. 1.
Figure 3:
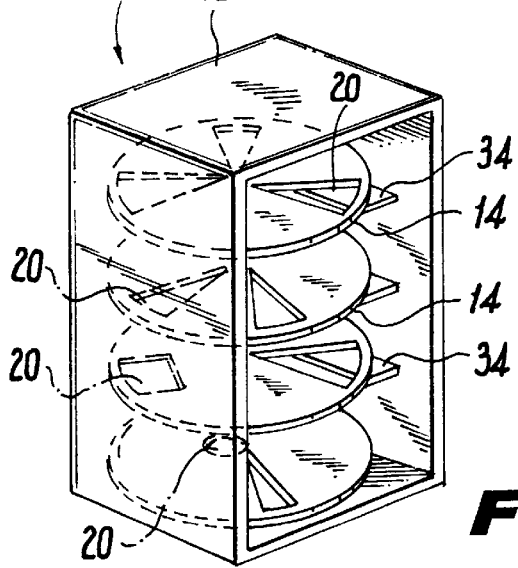
FIG. 3 is a schematic illustration of a library of shielding platters utilized for the reactive ion etching of a semiconductor wafer.

As illustrated in FIGS. 1 and 2, shielding platter 14 is placed on the surface 10 of semiconductor wafer 12 during the etching thereof.

The shielding platter 14, which is essentially a disk-shaped mask, is provided with at least one cutout 20 forming an open window for effecting the etching process on chips 22 located therebelow on the semiconductor wafer 12, as shown in FIG. 2. The shielding platter may be provided with a stand-off 24. As shown in FIG. 2, the stand-off may be formed by a flange structure extending downward from the bottom surface 26 of the platter 14. The stand-off typically extends about the periphery of the platter 14, and may also surround the cutouts or windows, as shown in detail in FIG. 2. The stand-off thus provides a spacing of (for instance) 2 mm between the bottom surface 26 of the platter 14 and the upper facing surface 10 of the wafer 12.

The stand-off structure inhibits physical contact between the surface 10 of the semiconductor wafer and the facing surface 26 of the shielding platter 14, thereby minimizing any potential mechanical damage to the wafer surface or chips during relative movement between the shielding platter 14 and the wafer 12. For example, a given wafer may be etched multiple times using the platter 14 with the single window 20 shown in FIG. 1, by (1) raising the platter off the wafer, (2) rotating the platter to position the window over an unetched portion of the surface 10, and (3) lowering the platter onto the wafer surface.

As noted above, it is desirable to have the composition of the platter 14 (or at least the upper surface thereof) match the composition of the exposed portion of the wafer surface 10. For this purpose, the shielding platter 14 may be provided with regions of different materials; for example, as shown in FIG. 2, a plurality of concentric rings 16, 18 of alternating materials A and B. The materials are chosen so that the platter 14, when exposed to the etching plasma, mimics the surface composition of the shielded portion of the wafer. For example, in a process where Si is etched with a photoresist mask, material A may be Si while material B is photoresist.

In this regard, the arrangement shown in FIG. 1 (a wedge-shaped window 20 with concentric rings 16, 18 of alternating materials) is preferable, since the relative proportion of materials is kept generally uniform over the combined wafer/platter surface. Of course, the precise composition and arrangement of materials on the platter surface will depend on the characteristics of the wafer surface 10 to be etched. Various materials can be formed or deposited on the surface of the platter 14 using methods well-known to those skilled in the art.

In accordance with the present invention, it may be desirable to provide a library 30 of shielding platters 14 each having differently configured windows 20. Thus, each shielding platter 14 may have, for instance, one or more cutouts of various shapes and sizes distributed about the surface, possibly including a centrally located cutout, as desired. The library 30 may include a stand or cabinet structure 32 having shelves 34 or other suitable supports for holding a stack of platters 14. The shielding platters 14 may be individually removed from the stand or cabinet 32 and selectively utilized to form different etched patterns to the surface 10 of a semiconductor wafer 12. This provides a simple and inexpensive system for testing a variety of processes for etching wafers with different surface compositions.

While there has been shown and described what are considered to be preferred embodiments of the invention, it will, of course, be understood that various modifications and changes in form or detail could readily be made without departing from the spirit of the invention. It is, therefore, intended that the invention be not limited to the exact form and detail herein shown and described, nor to anything less than the whole of the invention herein disclosed as hereinafter claimed.

What is claimed is:

1. An arrangement for the masking of selected surface portions of a semiconductor wafer during reactive ion etching of said semiconductor wafer; said arrangement comprising:

(a) a shielding platter consisting of a disk-shaped mechanical mask having portions with different materials, said shielding platter being superimposed on said semiconductor wafer so as to substantially cover the surface of said semiconductor wafer; and (b) at least one cutout in said shielding platter forming a window exposing a predetermined area of the surface of said semiconductor wafer to facilitate reactive ion etching of said exposed surface area, said shielding platter means being repositionable on said semiconductor wafer to expose other specified surface areas thereof for reactive ion etching.

2. An arrangement as claimed in claim 1, wherein said shielding platter includes a stand-off structure about the periphery of said shielding platter for positioning said shielding platter at a predetermined distance above the surface of said semiconductor wailer, thereby avoiding damage thereto due to contact between the surface of the semiconductor wafer and the shielding platter during repositioning of said shielding platter relative to said semiconductor wafer.

3. An arrangement as claimed in claim 2, wherein said stand-off structure maintains a spacing of at least about 2 mm between said shielding platter and the surface of said semiconductor wafer.

4. An arrangement as claimed in claim 1, wherein said portions are arranged as concentric rings of alternating materials.

5. An arrangement as claimed in claim 1, wherein said materials are selected to be compatible with materials comprising said exposed surface of said wafer.

6. An arrangement as claimed in claim 1, wherein said shielding platter includes a plurality of said cutouts of varying shapes and sizes so as to facilitate the etching of a plurality of selected areas on the wafer surface.

7. An arrangement as claimed in claim 1, wherein repositioning of said shielding platter on said semiconductor wafer enables repetitive etching of said semiconductor wafer under differing processing conditions for evaluation at the completion of said etching sequences.

* * * * *